United States Patent
Xiong et al.

(10) Patent No.: US 10,389,383 B2
(45) Date of Patent: Aug. 20, 2019

(54) LOW-COMPLEXITY LDPC ENCODER

(71) Applicant: SK Hynix Inc., Gyeonggi-do (KR)

(72) Inventors: Chenrong Xiong, San Jose, CA (US); Fan Zhang, Fremont, CA (US); Aman Bhatia, San Jose, CA (US); Abhiram Prabhakar, San Jose, CA (US); Yu Cai, San Jose, CA (US); Naveen Kumar, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 59 days.

(21) Appl. No.: 15/654,492

(22) Filed: Jul. 19, 2017

(65) Prior Publication Data

US 2019/0028117 A1  Jan. 24, 2019

(51) Int. Cl.
*H03M 13/11* (2006.01)
*H03M 13/25* (2006.01)
*H03M 13/00* (2006.01)

(52) U.S. Cl.
CPC ...... *H03M 13/1162* (2013.01); *H03M 13/118* (2013.01); *H03M 13/1137* (2013.01); *H03M 13/1182* (2013.01); *H03M 13/255* (2013.01); *H03M 13/6561* (2013.01); *H03M 13/616* (2013.01)

(58) Field of Classification Search
CPC ......... H03M 13/1162; H03M 13/1137; H03M 13/118; H03M 13/1182; H03M 13/255; H03M 13/6561; H03M 13/616
USPC ....... 714/758, 752, 763, 786, 746, 755, 782, 714/784, 800, 801
See application file for complete search history.

(56) References Cited

U.S. PATENT DOCUMENTS

| | | | | |
|---|---|---|---|---|
| 7,162,684 B2 * | 1/2007 | Hocevar | ............ | H03M 13/116 714/800 |
| 8,065,598 B1 * | 11/2011 | Gunnam | ............ | H03M 13/116 714/800 |
| 8,196,010 B1 * | 6/2012 | Gunnam | ............ | H03M 13/116 714/758 |
| 9,537,508 B1 * | 1/2017 | Nguyen | ............ | H03M 13/1105 |
| 2004/0148560 A1 * | 7/2004 | Hocevar | ............ | H03M 13/116 714/801 |
| 2005/0289438 A1 * | 12/2005 | Massey | ............ | H03M 13/296 714/758 |

OTHER PUBLICATIONS

T. J. Richardson, and R. L. Urbanke, "Efficient encoding of low-density parity-check codes," IEEE Transactions on Information Theory, vol. 47, No. 2, pp. 638-656, Feb. 2001, 19 pages.

* cited by examiner

*Primary Examiner* — John J Tabone, Jr.

(74) *Attorney, Agent, or Firm* — Kilpatrick Townsend & Stockton LLP

(57) ABSTRACT

Techniques are described for encoding information data bits using a low-density parity-check matrix optimized for a Low-Density Parity-Check (LDPC) encoder. In an example, the parity-check matrix includes a first matrix and a second matrix. The second matrix is a square matrix, and is also a block diagonal matrix that includes a set of square submatrices located on the diagonal of the block diagonal matrix. An intermediate vector is generated based on the information data bits and the first matrix, and a parity vector of a codeword is generated based on the intermediate vector and the second matrix.

20 Claims, 11 Drawing Sheets

$$H = \begin{matrix} & C0 & C1 & C2 & C3 & C4 \\ V0 & 1 & 1 & 0 & 0 & 0 \\ V1 & 1 & 0 & 1 & 0 & 0 \\ V2 & 1 & 0 & 0 & 1 & 0 \\ V3 & 1 & 0 & 0 & 0 & 1 \\ V4 & 0 & 1 & 1 & 0 & 0 \\ V5 & 0 & 1 & 0 & 1 & 0 \\ V6 & 0 & 1 & 0 & 0 & 1 \\ V7 & 0 & 0 & 1 & 0 & 1 \\ V8 & 0 & 0 & 1 & 0 & 0 \\ V9 & 0 & 0 & 0 & 1 & 1 \end{matrix}$$

$$H \overset{300}{=} \begin{bmatrix} 1 & 0 & 1 & 0 & 0 & 1 \\ 1 & 1 & 0 & 0 & 1 & 0 \\ 1 & 0 & 0 & 1 & 0 & 0 \\ 0 & 1 & 0 & 1 & 0 & 1 \end{bmatrix}$$

402: 
$$\begin{bmatrix} 1 & 1 & 0 & 1 & 0 & 0 & 1 & 1 \\ 0 & 1 & 1 & 0 & 0 & 1 & 0 & 1 \\ 1 & 0 & 0 & 1 & 0 & 1 & 1 & 0 \\ 1 & 0 & 0 & 1 & 1 & 0 & 1 & 1 \end{bmatrix}$$

402:
$$\begin{bmatrix} 1 & 1 & 0 & 1 & 0 & 0 & 1 & 1 \\ 0 & 1 & 1 & 0 & 0 & 1 & 0 & 1 \\ 1 & 0 & 0 & 1 & 0 & 1 & 1 & 0 \\ 1 & 0 & 0 & 1 & 1 & 0 & 1 & 1 \end{bmatrix}$$

410: = [1 1 1 0 0 1]

900

$K$ ⟵910      $N-K$ ⟵920

$$H = \begin{bmatrix} 110011 & 0000000010 \\ 101000 & 1110000000 \\ 100101 & 0000001100 \\ 100010 & 0000010100 \\ 011100 & 0000000011 \\ 011001 & 0000100000 \\ 010110 & 0000011000 \\ 010100 & 0001100000 \\ 010011 & 1010000000 \\ 001001 & 0110000000 \end{bmatrix} \begin{matrix} \leftarrow C0 \\ \leftarrow C1 \\ \leftarrow C2 \\ \leftarrow C3 \\ \leftarrow C4 \\ \leftarrow C5 \\ \leftarrow C6 \\ \leftarrow C7 \\ \leftarrow C8 \\ \leftarrow C9 \end{matrix} \Bigg\} N\text{-}K$$

$$H' = \begin{bmatrix} 101000 & 1110000000 \\ 010011 & 1010000000 \\ 001001 & 0110000000 \\ 010100 & 0001100000 \\ 011001 & 0000100000 \\ 100010 & 0000010100 \\ 010110 & 0000011000 \\ 100101 & 0000001100 \\ 110011 & 0000000010 \\ 011100 & 0000000011 \end{bmatrix} \begin{matrix} \leftarrow C1 \\ \leftarrow C8 \\ \leftarrow C9 \\ \leftarrow C7 \\ \leftarrow C5 \\ \leftarrow C3 \\ \leftarrow C6 \\ \leftarrow C2 \\ \leftarrow C0 \\ \leftarrow C4 \end{matrix} \Bigg\} N\text{-}K$$

FIG. 9B

LOW-COMPLEXITY LDPC ENCODER

BACKGROUND

The present disclosure generally relates to a Low-Density Parity-Check (LDPC) encoder.

Data integrity is an essential feature for any data storage device. Use of strong error-correction codes (ECCs) is recommended for NAND flash memory devices as the storage density increases with the use of multi-level cell/triple level cell (MLC/TLC) NAND flash. LDPC codes are often used as the ECC scheme in storage devices.

During code design, the parity-check matrix for an LDPC decoder may be constructed with random computer search or algebraic constructions to give best decoding performance. In some cases, these construction methods may not lead to a parity-check matrix which has the structure preferred for an efficient encoder. Because the complexity of encoding using a parity-check matrix may be in the order of the quadratic of the number of rows in the parity-check matrix, an LDPC encoder using a parity-check matrix may result in relatively larger memory usage, computational complexity, and power consumption for a large parity-check matrix even though the LDPC encoder may properly encode data bits.

SUMMARY

The present disclosure generally relates to encoding information data bits using a parity-check matrix. For example, techniques disclosed herein may use a parity-check matrix having a block diagonal matrix for use by an encoder, such as an LDPC encoder, to reduce the computational complexity for computing the parity vector and reduce the memory space used for storing the parity-check matrix.

In some embodiments, a computer-implemented method of encoding an information vector may include receiving the information vector to be encoded into an LDPC codeword by the computer system, and accessing a parity-check matrix that may include a first matrix and a second matrix. The second matrix may include a block diagonal matrix, and the block diagonal matrix may include a set of square submatrices located on a diagonal of the block diagonal matrix. The computer-implemented method may further include generating an intermediate vector based on the information vector and the first matrix, generating a parity vector based on the intermediate vector and the second matrix, and generating the LDPC codeword including the information vector and the parity vector. In some implementations, the computer-implemented method may further include writing the LDPC codeword to a storage device, or transmitting the LDPC codeword via a communication channel. In some implementations, generating the parity vector may include dividing the intermediate vector into a set of intermediate sub-vectors, where each intermediate sub-vector may correspond to a square submatrix of the set of square submatrices. For each intermediate sub-vector of the set of intermediate sub-vectors, a corresponding parity sub-vector of a set of parity sub-vectors for the parity vector may be generated based on the intermediate sub-vector and the corresponding square submatrix, for example, by multiplying the intermediate sub-vector and an inverse of a transpose of the corresponding square submatrix. In some implementations, each parity sub-vector may be generated by a separate operating unit of the computer system, and the parity sub-vectors may be generated in parallel by corresponding operating units of the computer system.

In certain embodiments, a system may include one or more memories configured to store a parity-check matrix. The parity-check matrix may include a first matrix and a second matrix, where the second matrix may include a block diagonal matrix, and the block diagonal matrix may include a set of square submatrices located on a diagonal of the block diagonal matrix. The system may further include a low-density parity-check (LDPC) encoder coupled to the one or more memories. The LDPC encoder may be configured to receive an information vector to be encoded into an LDPC codeword, access the parity-check matrix from the one or more memories, generate an intermediate vector based on the information vector and the first matrix, generate a parity vector based on the intermediate vector and the second matrix, and generate the LDPC codeword including the information vector and the parity vector. In some implementations, generating the parity vector may include dividing the intermediate vector into a set of intermediate sub-vectors, where each intermediate sub-vector may correspond to a square submatrix of the set of square submatrices in the second matrix; and, for each intermediate sub-vector of the set of intermediate sub-vectors, generating a corresponding parity sub-vector of a set of parity sub-vectors for the parity vector based on the intermediate sub-vector and the corresponding square submatrix. In some implementations, the LDPC encoder may include a set of operating units for generating the set of parity sub-vectors in parallel. In some implementations, the system may further include a transmit unit that may be configured to write the LDPC codeword to a storage device, or transmit the LDPC codeword via a communication channel.

In certain embodiments, a non-transitory computer-readable storage medium storing a plurality of instructions is disclosed. The plurality of instructions, when executed by a system, may cause the system to receive an information vector to be encoded into an LDPC codeword, access a parity-check matrix that may include a first matrix and a second matrix, generate an intermediate vector based on the information vector and the first matrix, generate a parity vector based on the intermediate vector and the second matrix, and generate the LDPC codeword including the information vector and the parity vector. The second matrix may include a block diagonal matrix that may have a set of square submatrices located on a diagonal of the block diagonal matrix. In some implementations, the instructions may further cause the system to write the LDPC codeword to a storage device, or transmit the LDPC codeword via a communication channel. In some implementations, generating the intermediate vector may include multiplying the information vector and a transpose of the first matrix. In some implementations, generating the parity vector may include dividing the intermediate vector into a set of intermediate sub-vectors, where each intermediate sub-vector may correspond to a square submatrix of the set of square submatrices; and performing, in parallel and for each intermediate sub-vector of the set of intermediate sub-vectors, the operation of generating a corresponding parity sub-vector of a set of parity sub-vectors for the parity vector by multiplying a respective intermediate sub-vector of the set of intermediate sub-vectors and an inverse of a transpose of a corresponding square submatrix of the set of square submatrices.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 2 illustrates an example parity-check matrix.

FIG. 4A illustrates an example codeword that passes a parity check by an example parity-check matrix.

FIG. 4B illustrates an example codeword that fails a parity check by an example parity-check matrix.

FIG. 9A illustrates an example original parity-check matrix, according to certain embodiments.

FIG. 9B illustrates an example encoder-optimized parity-check matrix, according to certain embodiments.

DETAILED DESCRIPTION

Figure 1:
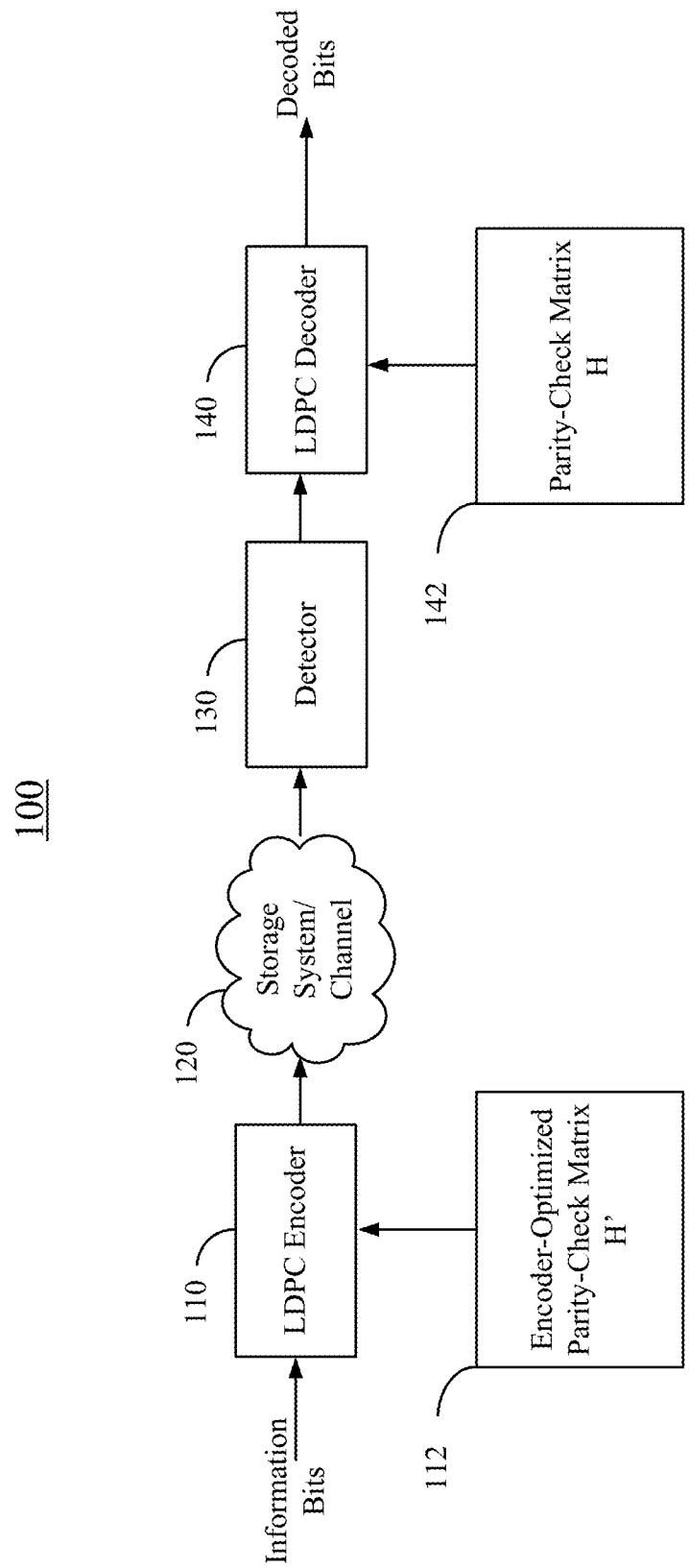
FIG. 1 illustrates a high level block diagram of an example error correction system, according to certain embodiments.

In the following description, for the purposes of explanation, specific details are set forth in order to provide a thorough understanding of examples of the disclosure. However, it will be apparent that various examples may be practiced without these specific details. For example, devices, systems, networks, units, processes, and other components may be shown as components in block diagram form in order to not obscure the examples in unnecessary detail. In other instances, well-known devices, processes, systems, structures, units, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof.

An error-correcting code (ECC) coding, such as forward error correction (FEC) coding, is a process of adding redundant data or parity data to a message, such that the message can be recovered by a receiver even when some errors may have occurred either during the process of transmission or on a storage device. Error-correcting codes may often be used in lower-layer communication, as well as for reliable storage in storage media, such as CDs, DVDs, hard disks, FLASH, and RAM.

Error-correcting codes may include convolutional codes or block codes. Convolutional codes are generally processed on a bit-by-bit basis, while block codes are generally processed on a block-by-block basis. Turbo codes and low-density parity-check (LDPC) codes are constructions that may provide good efficiencies for block codes.

LDPC codes are linear block codes that may be defined by a sparse binary parity-check matrix (often referred to as an H-Matrix), which includes only zeros and ones. The parity-check matrix may be used to check whether a received codeword has errors or not. The term "sparse matrix" is used herein to refer to a matrix in which a number of non-zero values in each column and each row is much less than its dimension. For example, less than 5%, 2%, or 1% of a parity-check matrix may be 1's while the rest are 0's. LDPC codes may minimize the probability of errors and thus the data transmission can have a performance close to the Shannon's limit. Thus, LDPC codes have increasingly been used for error corrections. LDPC codes may be especially suitable for usage in memory devices that can be accessed to get both hard-bit (binary) and soft-bit (probabilities of bits) data, such as NAND Flash memories, because of their ability to process both hard-bit and soft-bit information. With the added benefit of being able to process soft-bit information, LDPC codes may allow the correction of more errors for the same Data-to-Parity bits ratio compared with other ECC techniques.

The term "column weight" is used herein to refer to the number of non-zero values in a specific column of the parity-check matrix. The term "row weight" is used herein to refer to the number of non-zero values in a specific row of the parity-check matrix. LDPC codes can be categorized into regular LDPC codes and irregular LDPC codes. Regular LDPC codes have a same number of 1's (i.e., row weight) in each row, and a same number of 1's (e.g., column weight) in each column. Irregular LDPC codes may relax the constant weight condition in that the rows and columns can have varying numbers of 1's. Irregular LDPC codes are known to perform better than regular LDPC codes because the number of 1's can be skewed to provide optimal distribution across the codeword bits. Usually, long and irregular LDPC codes are known to provide a higher performance for error correction.

The LDPC codes may also be described according to the way they are constructed. Random computer search or algebraic constructions are possible. A random computer search construction describes an LDPC code having a parity-check matrix designed by a random computer-based procedure. Algebraic construction implies that the parity-check matrix is constructed based on combinatorial methods.

An (N, K) LDPC code may correspond to an (N−K)×N parity-check matrix H, where N represents the codeword length, K corresponds to the length of the information bit, and N−K corresponds to the length of the parity bits (i.e., parity vector). Each row of the parity-check matrix H may correspond to a parity-check equation. Each column of the parity-check matrix H may correspond to a codeword bit. An (N−K)×N parity-check matrix H may correspond to a K×N generator matrix G, where G×H$^T$=0. In certain LDPC encoders (e.g., a systematic LDPC encoder), the computational complexity of encoding LDPC codewords may be in the order of the quadratic of the number of rows N−K (i.e., the number of equations or length of the parity vector) of the parity-check matrix. Thus, an LDPC encoder may result in relatively larger memory usage, computational complexity, and power consumption for a large parity-check matrix even though the LDPC encoder may properly encode data bits. In addition, (N−K)×N bits may be needed to store the parity-check matrix H that may be used in the systematic LDPC encoder.

Embodiments of the present disclosure relate to an encoder-optimized parity-check matrix for use by an LDPC encoder to reduce the computational complexity for computing the parity vector and reduce the memory space used for storing the encoder-optimized parity-check matrix. For example, an encoder-optimized parity-check matrix including A rows may include a plurality of smaller square submatrices on the diagonal each having a smaller number of rows $a_1, a_2, a_3, \ldots$, or $a_b$, where $A=a_1+a_2+a_3+\ldots+a_b$. As a result, the computational complexity may be reduced from the order of $A^2$ to the order of $a_1^2+a_2^2+a_3^2+\ldots+a_b^2$. For example, if there are 10 submatrices and each the submatrices has a same number of rows of a, the computational complexity may be reduced from the order of $A^2=(10\times a)^2=100\times a^2$ to the order of $10\times a^2$. Similarly, the memory space used to store the encoder-optimized parity-check matrix can be reduced by at least $100\times a^2-10\times a^2=90\times a^2$. Thus, both the memory usage and the computational complexity (and therefore the power usage) can be significantly reduced.

FIG. 1 illustrates a high level block diagram of an example error correction system 100, in accordance with certain embodiments. In the example shown in FIG. 1, LDPC codes are described in connection with data storage, such as NAND Flash memories. However, embodiments of the disclosed techniques are not limited as such. For example, the embodiments may similarly apply to other usage of LDPC codes, including, for example, data transmission. In various embodiments, error correction system 100 may be implemented using a variety of techniques, including one or more application-specific integrated circuits (ASICs), one or more field-programmable gate arrays (FPGAs), and/or one or more general purpose processors (e.g., an Advanced RISC Machine (ARM) core).

As illustrated, an LDPC encoder 110 of error correction system 100 may receive information bits that include data which is desired to be stored in a storage system 120. LDPC encoded data may be generated by LDPC encoder 110 and may be written to storage system 120. The encoding may use an encoder-optimized parity-check matrix H' 112. Example techniques for generating and utilizing encoder-optimized parity-check matrix H' 112 are further described below.

In various embodiments, storage system 120 may include a variety of storage types or media, such as disk drive storage (e.g., magnetic disk drive storage), Flash storage, etc. Errors may occur in data storage. For example, the errors may be caused by, for example, cell-to-cell interference and/or coupling. In some embodiments, the techniques disclosed herein may be employed in a transceiver, and, instead of being written to or read from storage, the data may be transmitted and received over a wired and/or wireless channel. In such cases, the errors in a received codeword may be introduced during the transmission of the codeword.

When the stored data is requested or otherwise desired (e.g., by an application or user which stored the data), a detector 130 may receive data from storage system 120. The received data may include some noise or errors. Detector 130 may perform detection on the received data and output decision and/or reliability information. For example, a soft output detector may output reliability information and a decision for each detected bit. A hard output detector may output a decision on each bit without providing corresponding reliability information. More specifically, a hard output detector may output a decision that a particular bit is a "1" or a "0" without indicating how certain the detector is for that decision. In contrast, a soft output detector may output a decision and reliability information associated with the decision. In general, a reliability value indicates how certain the detector is for a given decision. In one example, a soft output detector may output a log-likelihood ratio (LLR), where the sign of the LLR may indicate the decision (e.g., a positive value may correspond to a "1" decision and a negative value may correspond to a "0" decision), and the magnitude may indicate how confident the detector is for the particular decision (e.g., a large magnitude indicates a high reliability or certainty).

The decision and/or reliability information may be passed to an LDPC decoder 140 which may perform LDPC decoding using the decision and/or reliability information. A soft LDPC decoder may utilize both the decision and the reliability information to decode the codeword. A hard LDPC decoder may utilize only the decision values from the detector to decode the codeword. The decoded bits generated by LDPC decoder 140 may be passed to an appropriate entity (e.g., the user or application which requested it). The decoding may utilize a parity-check matrix H 142, which may be optimized for LDPC decoder 140 by design. With proper encoding and decoding, the decoded bits would match the information bits. In some implementations, parity-check matrix H 142 may be same as encoder-optimized parity-check matrix H' 112. In some implementations, encoder-optimized parity-check matrix H' 112 may be modified from parity-check matrix H 142. In some implementations, parity-check matrix H 142 may be modified from encoder-optimized parity-check matrix H' 112.

A feature of LDPC codes is that the corresponding parity-check matrix H (i.e., H-Matrix) has a low number of 1's and hence is sparse. A parity-check matrix H may represent a plurality of parity-check equations and may be used to check if the received codeword has any errors or not. Since the rows of the H-Matrix correspond to the parity-check equations and the columns correspond to codeword bits, a low number of 1's in the H-matrix means that the parity-check equations would be dependent on few codeword bits only. Thus, if a parity-check equation fails, it is relatively easier to figure out which codeword bits may have error because of the low number of 1's in the check equation. If a codeword bit is present in multiple failing parity-check equations, it greatly increases the probability that this particular codeword bit is erroneous. Thus, the number of iterations required to flip all the erroneous codeword bits is much less when compared to other ECC techniques.

FIG. 2 illustrates an example parity-check matrix H 200. Parity-check matrix H 200 may be an example of parity-check matrix H 142 of FIG. 1. In the example, parity-check matrix H 200 is a 5×10 matrix. Thus, the codeword length is 10, the number of parity bits is 5, and the number of information bits in a codeword is 5. Each row of parity-check matrix H 200 may correspond to a parity-check equation C0, C1, C2, C3, or C4, and each column of parity-check matrix H 200 may correspond to a codeword bit V0, V1, . . . , or V9. During a parity check, if a parity-check equation fails (e.g., gives a result of "1"), the codeword bits that have a "1" in the row of parity-check matrix H that corresponds to the parity-check equation may have an error. For example, if parity-check equation C1 fails, one or more of codeword bits V0, V4, V5, and V6 may have an error. If parity-check equation C2 also fails, one or more of codeword bits V1, V4, V7, and V8 may have an error. Thus, it is very likely that codeword bit V4 is erroneous and should be flipped. In this way, the entity that receives the codeword can correct the erroneous bits, if any, by flipping these identified erroneous bits.

LDPC codes may be represented by bipartite graphs. One set of nodes of a bipartite graph is the variable or bit nodes, which may correspond to bits of the codeword. The other set of nodes may be referred to as check nodes, which may correspond to the set of parity-check constraints satisfied by the codewords. The edge connections between the variable nodes and the check nodes may be chosen at random. In an (r, c) regular code, each of n variable nodes (V1, V2, . . . , Vn) may have connections to r check nodes of m check nodes (C1, C2, . . . , Cm), and each of the m check nodes may have connections to c variable nodes. In an irregular LDPC code, the check node degree may not be uniform. Similarly, the variable node degree may not be uniform.

Figures 3A, 3B:
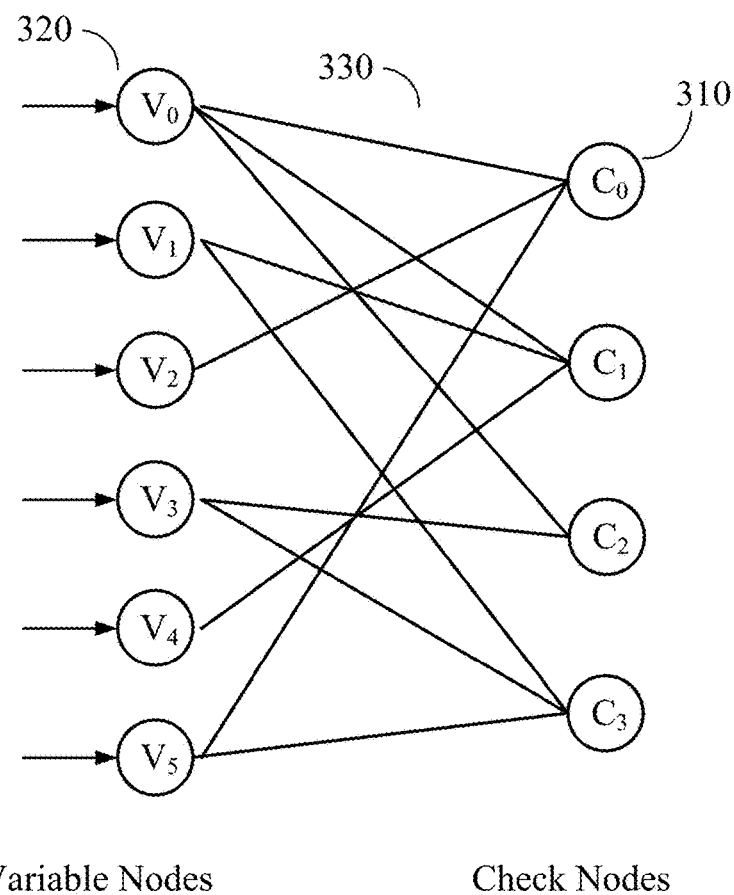
FIG. 3A illustrates an example parity-check matrix.
FIG. 3B illustrates an example graph representing the example parity-check matrix of FIG. 3A, according to certain embodiments.

FIG. 3A illustrates an example parity-check matrix 300. FIG. 3B illustrates an example bipartite graph corresponding to parity-check matrix 300. Parity-check matrix 300 may be an example of parity-check matrix H 142 of FIG. 1. In this example, parity-check matrix 300 includes six column vectors and four row vectors. Network 330 shows the network corresponding to parity-check matrix 300 and represent a bipartite graph. Various types of bipartite graphs are possible including, for example, a Tanner graph.

Generally, variable nodes 320 in network 330 correspond to the column vectors in parity-check matrix 300. Check nodes 310 in network 330 correspond to the row vectors of parity-check matrix 300. The interconnections between the nodes are determined by the values of parity-check matrix 300. Specifically, a "1" in parity-check matrix 300 may indicate that the corresponding check node and variable node have a connection. A "0" in parity-check matrix 300 may indicate that there is no connection between the corresponding check node and variable node. For example, the "1" in the leftmost column vector and the second row vector from the top in parity-check matrix 300 corresponds to the connection between variable node V0 and check node C1.

A message passing algorithm may be used to decode LDPC codes. Examples of the message passing algorithm may include min-sum algorithm, scaled min-sum algorithm, or the like. In general, any of the variations of the message passing algorithm may be used in an LDPC decoder without departing from the teachings of the present disclosure. Message passing may use a network of variable nodes and check nodes, as shown in FIG. 3B. The connections between variable nodes and check nodes are described by and correspond to the values of the parity-check matrix 300, as shown in FIG. 3A.

For example, a hard decision message passing algorithm may be performed by the decoder. Each of the variable nodes may send a message to one or more check nodes that are connected to it. The message may be a value that each of the variable nodes believes to be its correct value. Each of the check nodes may calculate a response to send to the variable nodes that are connected to it, using the information that it previously received from the variable nodes. The response may correspond to a value that the check node believes that the variable node should have based on the information received from the other variable nodes connected to that check node. The response may be calculated using the parity-check equations which force the values of all the variable nodes that are connected to a particular check node to sum up to zero (modulo 2). If all the equations at all the check nodes are satisfied, the decoder may declare that a correct codeword is found.

If a correct codeword is not found, iterations may be performed. In each iteration, an update from the variable nodes may be performed using the messages that they received from the check nodes to decide if the bits at their positions should be a zero or a one by a majority rule. The variable nodes may then send this hard decision message to the check nodes that are connected to them. The iterations may continue until a correct codeword is found or a maximum number of iterations have been performed without finding a correct codeword.

A soft decision message passing decoder may work similarly. However, each of the messages that are passed among check nodes and variable nodes may also include the reliability of each bit. The decoder may utilize both the decision and the reliability information to determine the correct codeword.

As described above, an (N−K)×N parity-check matrix H may be used for an (N, K) LDPC decoder and/or encoder (e.g., the encoder may use the transpose of this parity-check matrix-$H^T$), where N may represent the desired codeword length, K may correspond to the length of the information bits, and N−K may correspond to the length of the parity bits (i.e., parity vector). Since H is the parity-check matrix, parity-check matrix H and a codeword x generated by the LDPC encoder would satisfy the following equation:

$$x \times H^T = 0, \quad (1)$$

where T is the matrix transpose operation.

FIG. 4A illustrates an example codeword 404 that passes a parity check by an example parity-check matrix 402, where codeword 404 corresponds to x of Equation (1) and parity-check matrix 402 corresponds to the transpose of parity-check matrix H (i.e., $H^T$) of Equation (1). Parity-check matrix 402 may be an example of parity-check matrix H 142 of FIG. 1. The resultant syndrome 406 is an all-zero vector, which indicates that codeword 404 passes the parity check.

FIG. 4B illustrates an example codeword 408 that fails the parity check by parity-check matrix 402. The resultant syndrome 410 is not an all-zero vector, and thus indicates that there might be errors in codeword 408.

According to certain embodiments, a parity-check matrix H may be divided into two parts, $$H = [H_1 H_2], \quad (2)$$

where submatrix $H_1$ may be an (N−K)×K matrix and submatrix $H_2$ may be an (N−K)×(N−K) matrix. An N-bit codeword x generated by the LDPC encoder may be divided into two parts accordingly: a K-bit information vector u and an (N−K)-bit parity vector p, where:

$$x = [u p]. \quad (3)$$

Thus, Equation 1 may be rewritten as:

$$x \times H^T = 0 \Rightarrow [u\,p] \times [H_1 H_2]^T = 0 \Rightarrow u \times H_1^T + p \times H_2^T = 0, \quad (4)$$

where "×" and "+" are of Galois field (GF)(2) and $(\bullet)^T$ is the matrix transpose operation over GF(2). For GF(2), an addition operation may be an exclusive OR (XOR) operation and an multiplication operation may be an AND operation. Therefore, parity vector p may be calculated by:

$$p = u \times H_1^T \times (H_2^T)^{-1} \quad (5)$$

where $(\bullet)^{-1}$ is the matrix inverse operation over GF(2). As such, an LDPC encoder may generate codeword x by calculating parity vector p using Equation 5 and concatenating parity vector p with information vector u.

Figure 5:
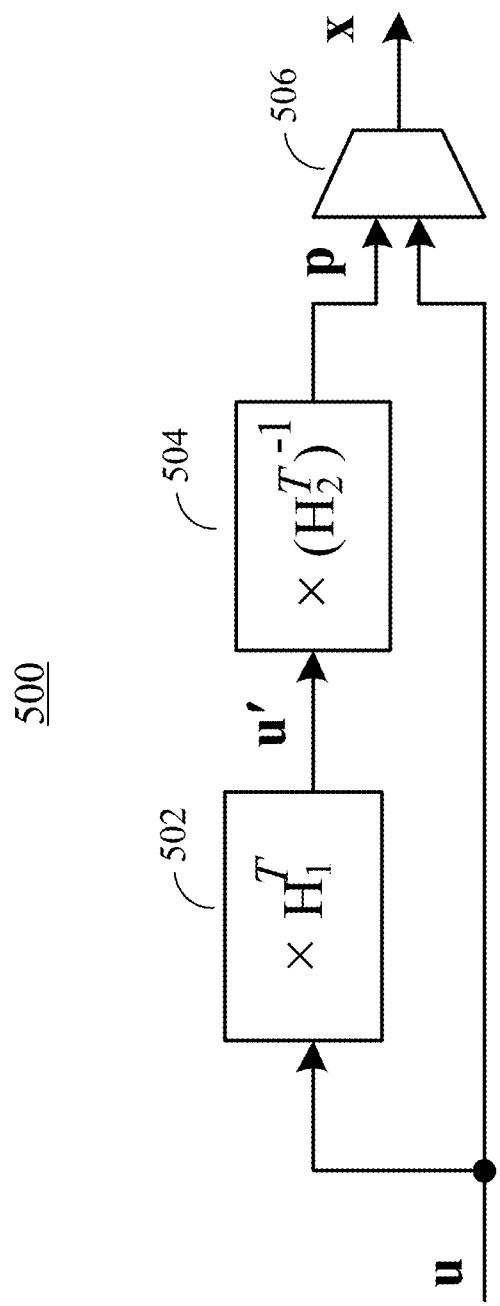
FIG. 5 illustrates an example architecture of a Low-Density Parity-Check (LDPC) encoder, according to certain embodiments.

FIG. 5 illustrates an example architecture of an LDPC encoder 500, according to certain embodiments. LDPC encoder 500 may include a first operating unit 502, a second operating unit 504, and a third operating unit 506. First operating unit 502 may be configured to perform a GF(2) multiplication operation on an input information vector u (e.g., k-bit) and matrix $H_1^T$ (e.g., a K×(N−K) matrix) described in Equation (5), to generate an intermediate vector u' that may include N−K bits. Second operating unit 504 may be configured to perform a GF(2) multiplication operation on intermediate vector u' and matrix $(H_2^T)^{-1}$ (e.g., an (N−K)×(N−K) matrix) described in Equation (5) to generate an (N−K)-bit parity vector p. Third operating unit 506 may concatenate information vector u and parity vector p to form a codeword x. In some embodiments, third operating unit 506 may include a multiplexer. In some embodiments, LDPC encoder 500 may include a transmit unit for writing codeword x to a storage device (e.g., a NAND flash memory) or transmitting codeword x to a remote device through a communication channel, such as a bus or a wireless channel.

In various embodiments, matrix $H_1^T$ and matrix $(H_2^T)^{-1}$ may be pre-determined based on the parity-check matrix H and stored in a working memory of the LDPC encoder. As described above, submatrix $H_1$ may be an (N−K)×K matrix and submatrix $H_2$ may be an (N−K)×(N−K) matrix. Therefore, (N−K)×K bits may be used in the working memory to store $H_1^T$, and (N−K)×(N−K) bits may be used in the working memory to store matrix $(H_2^T)^{-1}$.

The computational complexity of LDPC encoder 500 may be determined by $H_1^T$ and $(H_2^T)^{-1}$. Since the parity-check matrix H is of low-density, both $H_1^T$ and $H_2^T$ may be sparse matrices. As shown in FIG. 5, intermediate vector u' may be calculated by $u' = u \times H_1^T$. The computational complexity to calculate u' may be of an order of N (i.e., O(N)). $(H_2^T)^{-1}$ may be an (N−K)×(N−K) matrix and may not be a sparse matrix. Thus, the computational complexity to calculate p using Equation (5) is of an order of $(N-K)^2$ (i.e., $O((N-K)^2)$).

Therefore, for long codewords (large N), the computational complexity and the memory required may be quite large. To reduce the computational complexity for calculating parity vector p, a low-density encoder-optimized parity-check matrix $H_d$ with a block diagonal structure may be used as encoder-optimized parity-check matrix H' 112 of FIG. 1. For example, an (N−K)×N encoder-optimized parity-check matrix $H_d$ may be divided into two submatrices, $$H_d = [H_{1d} H_{2d}], \quad (6)$$

where submatrix $H_{1d}$ may be an (N−K)×K matrix, and submatrix $H_{2d}$ may be an (N−K)×(N−K) block diagonal matrix. Examples of the structure of submatrix $H_{2d}$ are described in detail below.

Figure 6:
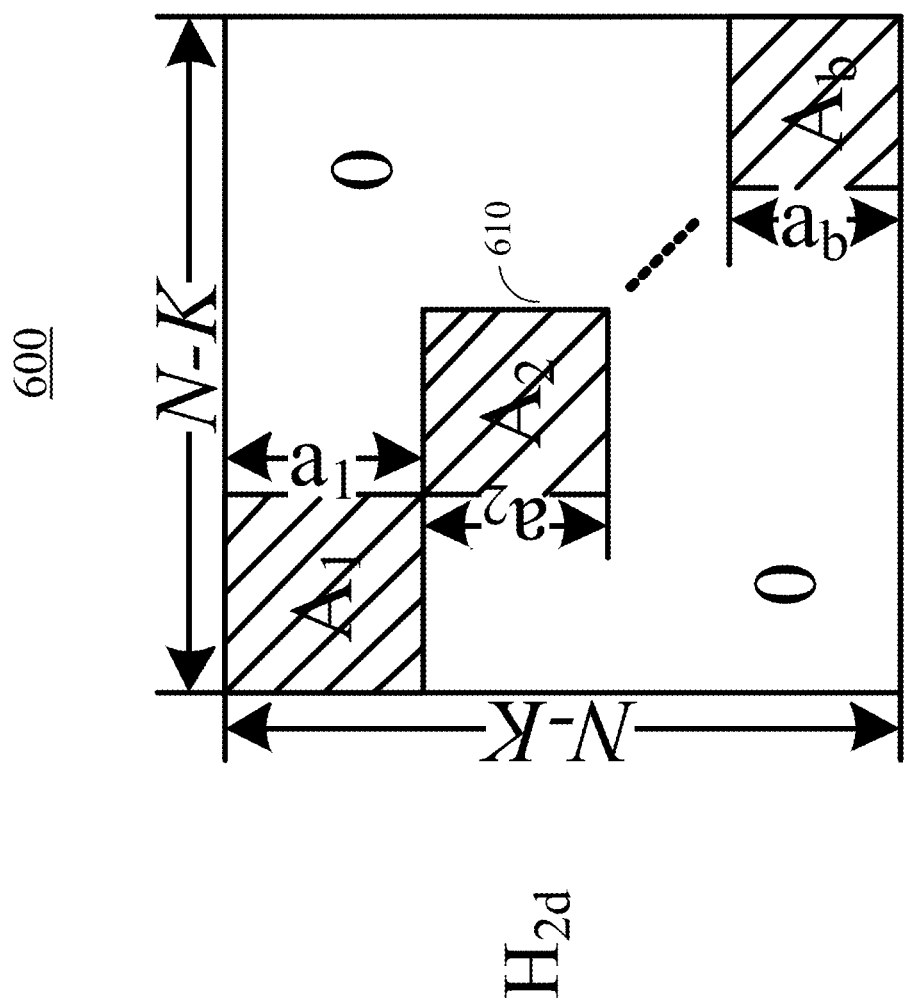
FIG. 6 illustrates an example block diagonal matrix, according to certain embodiments.

FIG. 6 illustrates an example block diagonal matrix 600, according to certain embodiments. Block diagonal matrix 600 may be an (N−K)×(N−K) matrix and may be used as submatrix $H_{2d}$ of Equation (6). As shown in FIG. 6, block diagonal matrix 600 may include a set of submatrices 610 located on the diagonal of block diagonal matrix 600. Other portions of block diagonal matrix 600 are all zeros. The set of submatrices 610 may include square matrices of different dimensions or the same dimension. In the example shown in FIG. 6, the set of submatrices 610 may include square submatrices $A_1, A_2, \ldots$, and $A_b$. Submatrix $A_1$ may be an $a_1 \times a_1$ matrix, submatrix $A_2$ may be an $a_2 \times a_2$ matrix, ..., and submatrix $A_b$ may be an $a_b \times a_b$ matrix. The sum of the dimensions $a_1, a_2, \ldots$, and $a_b$ of the b submatrices 610 is equal to N−K, i.e., $$(N-K) = a_1 + a_2 + \ldots + a_b. \quad (7)$$

In various implementations, the dimensions $a_1, a_2, \ldots$, and $a_b$ of the set of submatrices 610 may be a same number or may be different numbers.

Accordingly, parity vector p may also be divided into b sub-vectors as:

$$p = [p_1, p_2, \ldots, p_b], \quad (8)$$

where sub-vectors $p_1, p_2, \ldots, p_b$ are $a_1$-bit, $a_2$-bit, ..., and $a_b$-bit vectors, respectively. Based on Equations (6) and (8), Equation (4) may be rewritten as:

$$[u, p_1, p_2, \ldots, p_b] \times H_d^T = \quad (9)$$

$$[u, p_1, p_2, \ldots, p_b] \begin{bmatrix} H_{1d} & \begin{bmatrix} A_1 & 0 & \ldots & 0 \\ 0 & A_2 & 0 & \vdots \\ \vdots & 0 & \ddots & 0 \\ 0 & \ldots & 0 & A_b \end{bmatrix}^T \end{bmatrix} = 0$$

or:

$$u \times H_{1d}^T + [\, p_1 A_1^T \quad p_2 A_2^T \quad \ldots \quad p_b A_b^T \,] = 0 \quad (10)$$

Because $H_{2d}$ is a block diagonal matrix as described in FIG. 6, if an (N−K)-bit intermediate vector u'' is represented by:

$$u'' = u \times H_{1d}^T = [u_1'', u_2'', \ldots, u_b''], \quad (11)$$

where $u_1'', u_2'', \ldots, u_b''$ are $a_1$-bit, $a_2$-bit, ..., and $a_b$-bit intermediate sub-vectors, respectively, the following equations may be derived from Equation (10):

$$\begin{cases} p_1 = u_1'' \times (A_1^T)^{-1} \\ p_2 = u_2'' \times (A_2^T)^{-1} \\ \quad \vdots \\ p_b = u_b'' \times (A_b^T)^{-1} \end{cases}, \quad (12)$$

where $(\bullet)^{-1}$ is the matrix inverse operation. As such, parity vector p may be calculated by calculating individual parity sub-vectors $p_1, p_2, \ldots$, and $p_b$. An LDPC encoder may then be constructed based on Equations (11)-(12).

Figure 7:
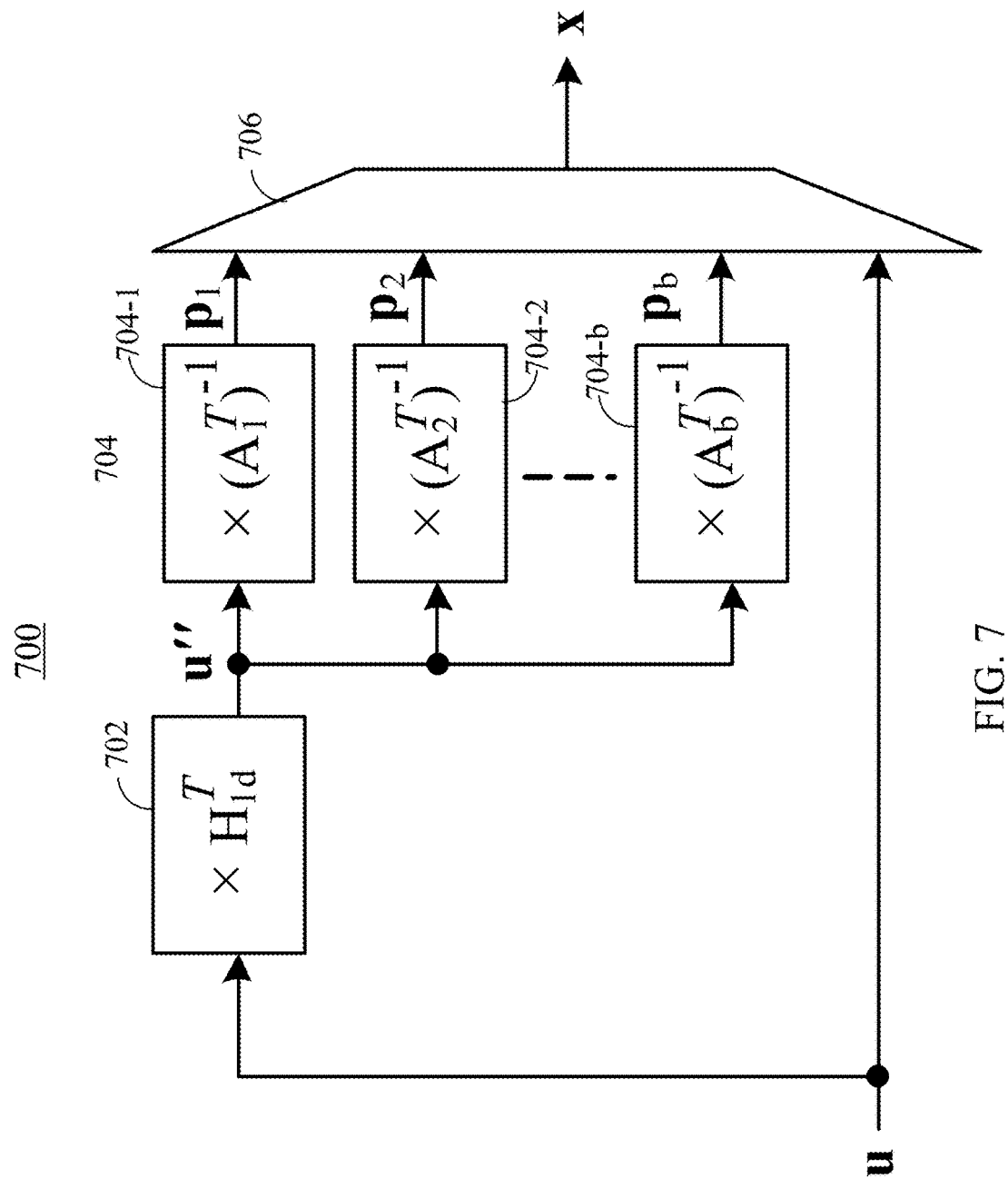
FIG. 7 illustrates an example architecture of an LDPC encoder using an encoder-optimized parity-check matrix having a parity-check matrix having a block diagonal matrix, according to certain embodiments.

FIG. 7 illustrates an example architecture of an LDPC encoder 700 using an encoder-optimized parity-check matrix having a block diagonal matrix, according to certain embodiments. LDPC encoder 700 may include a first operating unit 702, a set of second operating units 704, and a third operating unit 706. First operating unit 702 may be configured to perform a GF(2) multiplication operation on an input information vector u (i.e., k-bit) and matrix $H_{1d}^T$ (e.g., a K×(N−K) matrix) described in Equation (6) to generate an intermediate vector u" that may include N−K bits. The intermediate vector u" may then be divided into b intermediate sub-vectors $u_1"u_2", \ldots, u_b"$ as described above with respect to Equation (11). Each of the b intermediate sub-vectors may be used by a corresponding second operating unit 704 to generate a parity sub-vector $p_1, p_2, \ldots,$ or $p_b$. For example, second operating unit 704-1 may be configured to perform a GF(2) multiplication operation on intermediate vector $u_1"$ and matrix $(A_1^T)^{-1}$ as described in Equation (12) to generate an $a_1$-bit parity sub-vector $p_1$, second operating unit 704-2 may be configured to perform a GF(2) multiplication operation on intermediate vector $u_2"$ and matrix $(A_2^T)^{-1}$ to generate an $a_2$-bit parity sub-vector $p_2$, and so on. Operating units in the set of second operating units 704 may operate in parallel to generate the parity sub-vectors. Third operating unit 706 may concatenate information vector u and parity sub-vectors $p_1, p_2, \ldots,$ and $p_b$ to form a codeword x. In some implementations, third operating unit 706 may include a multiplexer.

Thus, using the block diagonal matrix, the computational complexity of LDPC encoder 700 for calculating p is $O(a_1^2+a_2^2+\ldots+a_b^2)$, which is lower than the computational complexity of $O((N-K)^2)$ using LDPC encoder 500, because $(N-K)=a_1+a_2+\ldots+a_b$, and thus $$(N-K)^2 = (a_1 + a_2 + \ldots + a_b)^2 \quad (13)$$
$$= a_1^2 + a_2^2 + \ldots + a_b^2 + 2a_1a_2 + 2a_1a_3 + \ldots + 2a_{b-1}a_b.$$

As an example, if N−K=10, b=5, and $a_1, a_2, \ldots,$ and $a_5$ are 2, $(N-K)^2$ would yield 100, while $a_1^2+a_2^2+\ldots+a_1^2$, would only yield 20.

In various embodiments, matrix $H_{1d}^T$ and matrices $(A_1^T)^{-1}, (A_2^T)^{-1}, \ldots,$ and $(A_b^T)^{-1}$ may be pre-calculated and stored in a working memory. As described above, submatrix $H_{1d}$ may be an (N−K)×K matrix. Therefore, as LDPC encoder 500, (N−K)×K bits may be used in the working memory of LDPC encoder 700 to store $H_{1d}^T$. However, LDPC encoder 700 may use only $(a_1^2+a_2^2+\ldots+a_b^2)$ bits, rather than $(N-K)^2$ bits, to store matrices $(A_1^T)^{-1}, (A_2^T)^{-1}, \ldots,$ and $(A_b^T)^{-1}$. Therefore, LDPC encoder 700 may use significantly less memory space than LDPC encoder 500 for encoding an information vector to generate a codeword.

As described above, parity-check matrix H 142 may be optimized for the LDPC decoder 140 by design. However, parity-check matrix H 142 may not necessarily have the block diagonal matrix shown in FIG. 6. Thus, parity-check matrix H 142 for the LDPC decoder may not be optimized for the LDPC encoder. In some implementations, the parity-check matrix H for the LDPC decoder may be re-arranged (e.g., permuted) to generate the encoder-optimized parity-check matrix H' (i.e., $H_d$) that includes the block diagonal matrix as shown in FIG. 6 for the LDPC encoder. In some implementations, the encoder-optimized parity-check matrix H' (e.g., the parity-check matrix H' 112) may be generated first, and may then be used to generate parity-check matrix H that may be optimized for the decoder (e.g., the parity-check matrix H 142). For example, encoder-optimized parity-check matrix H' may be generated by generating an initial parity-check matrix (not necessarily optimized for the decoder) and permuting the initial parity-check matrix to generate a matrix having an (N−K)×K matrix (i.e., $H_{1d}$) and (N−K)×(N−K) block diagonal matrix (i.e., $H_{2d}$) shown in FIG. 6.

Figure 8:
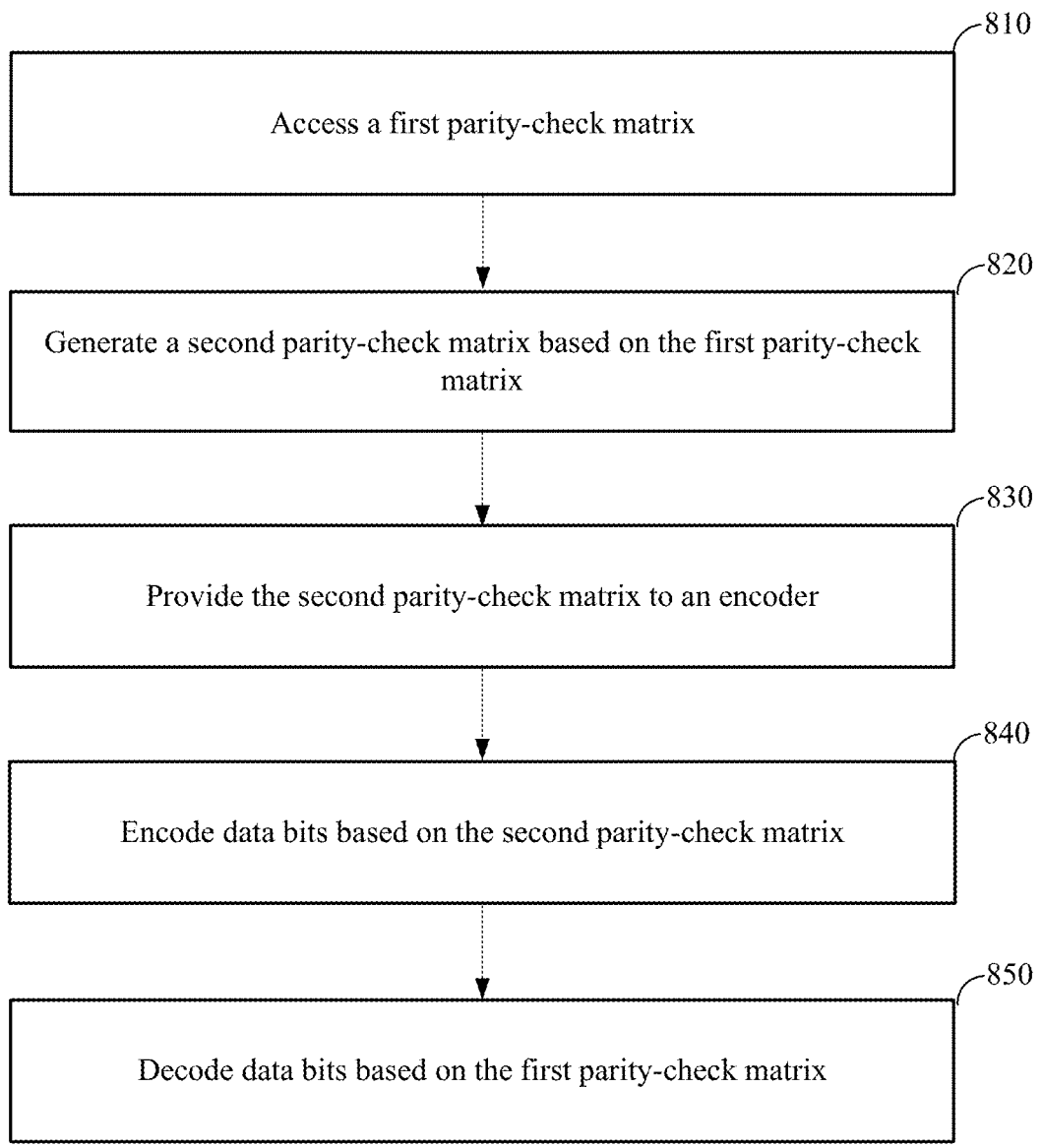
FIG. 8 illustrates an example flow for modifying a parity-check matrix designed for an LDPC decoder into an encoder-optimized parity-check matrix for an LDPC encoder, according to certain embodiments.

FIG. 8 illustrates an example flow 800 for modifying a parity-check matrix designed for an LDPC decoder into an encoder-optimized parity-check matrix for an LDPC encoder, according to certain embodiments. For clarity, the former parity-check matrix (designed for the LDPC decoder) is referred to herein as the original parity-check matrix or a first parity-check matrix, and may be used as parity-check matrix H 142 of FIG. 1. The latter parity-check matrix (optimized for the LDPC encoder) is referred to herein as the encoder-optimized parity-check matrix or a second parity-check matrix, and may be used as encoder-optimized parity-check matrix H' 112 of FIG. 1. The example flow 800 also facilitates using the two parity-check matrices to encode and decode data bits.

A system for performing particular operations of example flow 800 may include an offline system and an error correction system. One or both systems may have a specific hardware configuration to perform the operations. Alternatively, one or both systems may include generic hardware configured with specific instructions. For instance, each of the systems may include one or more processors and one or more memories. The memory(ies) of a system may store computer-readable instructions to embody functionalities specific to that system. The instructions, when executed by the processor(s) of the system, may result in the performance of the functionalities by the system.

In some implementations, the offline system may be configured to generate the encoder-optimized parity-check matrix, and the error correction system may be configured to encode and decode information bits. For instance, the error correction system may include an LDPC encoder and an LDPC decoder among other components, as described above with respect to FIG. 1. The LDPC encoder may use the encoder-optimized parity-check matrix to encode information bits. The LDPC decoder may use the original parity-check matrix or the encoder-optimized parity-check matrix to decode the encoded information bits.

At operation 810, the offline system may access a first parity-check matrix. In an example, the first parity-check matrix may be the original parity-check matrix designed for the decoder, such as parity-check matrix 142 of FIG. 1. The first parity-check matrix can be accessed from local storage of the offline system or from remote storage (e.g., from the storage local to the error correction system). The first parity-check matrix may be an (N−K)×N matrix.

At operation 820, the offline system may generate the second parity-check matrix based on the first parity-check matrix. In an example, the second parity-check matrix may be the encoder-optimized parity-check matrix designed for the encoder, such as parity-check matrix H' 112 of FIG. 1. The second parity-check matrix may be an (N−K)×N matrix and may include an (N−K)×(N−K) block diagonal matrix that includes a set of square submatrices as shown in FIG. 6. The offline system may identify the rows and/or columns in the first parity-check matrix that should be permuted in order to generate the (N−K)×(N−K) block diagonal matrix. The permutation may include, for example, rows and/or columns shifting, summation of rows and/or columns, etc. The permutation may then be applied to the rows and/or columns of the first parity-check matrix. The application of the permutation results in the second parity-check matrix. As known to one skilled in the art, there are many ways to more efficiently permute a matrix to generate a matrix with the desired block diagonal structure.

At operation 830, the offline system may provide the second parity-check matrix to the encoder. For example, the offline system may transmit the second parity-check matrix to the error correction system over a data network. The error correction system may receive and store this matrix in its local storage. Accordingly, the encoder may have access to the second parity-check matrix from the local storage of the error correction system.

At operation 840, the error correction system may encode information bits based on the second parity-check matrix. For example, the information bits may be received by the error correction system and may be provided to the encoder (e.g., LDPC encoder 700). The encoder may access the second parity-check matrix from the local storage and encode the information bits as described above with respect to FIG. 7.

At operation 850, the error correction system may decode the LDPC-encoded information bits. In the case of transmission of the LDPC-encoded information bits to another error correction system, the decoding may be performed at the other system. In either case, the relevant decoder (e.g., an LDPC decoder) may decode the LDPC-encoded information bits. In an example, the LDPC decoder may use the first parity-check matrix to decode the LDPC-encoded information bits. Because these bits are encoded based on the second parity-check matrix, and because the second parity-check matrix is a permutation of the first parity-check matrix, the decoding may result in permuted bits. Accordingly, the decoder may apply an inverse permutation to re-arrange the bits. In another example, the decoder may use the second parity-check matrix for the decoding, and thus re-arrangement of the decoded bits may not be needed with respect to the permutation between the two matrices.

In the next figures, example original parity-check matrix H and example encoder-optimized parity-check matrix H' are described to illustrate the generation of the example encoder-optimized parity-check matrix H'. These two example matrices are provided for illustration purposes only. The techniques disclosed in the present disclosure are not limited as such, and are similarly applicable to other matrices (e.g., different in size and/or values).

FIG. 9A illustrates an example original parity-check matrix H 900, according to certain embodiments. The example original parity-check matrix H 900 may be a 10×16 matrix that may be divided into a 10×6 matrix $H_1$ 910 and a 10×10 square matrix $H_2$ 920. It is noted that, in various embodiments, parity-check matrix H 900 may be any (N−K)×N matrix, matrix $H_1$ 910 may be an (N−K)×K matrix, and square matrix $H_2$ may be an (N−K)×(N−K) matrix. Each row of original parity-check matrix H 900 may correspond to a check node (e.g., C0, C1, . . . , C9) and each column of original parity-check matrix H 900 may correspond to a variable node as described above.

FIG. 9B illustrates an example encoder-optimized parity-check matrix H' 950, according to certain embodiments. Encoder-optimized parity-check matrix H' 950 may be an example of matrix $H_d$ in Equation (6), and may be used as encoder-optimized parity-check matrix H' 112 of FIG. 1. In the example, encoder-optimized parity-check matrix H' 950 may be a 10×16 matrix that may be divided into a 10×6 matrix $H_{1d}$ 960 and a 10×10 square matrix $H_{2d}$ 970. Encoder-optimized parity-check matrix H' 950 may be a permutation of original parity-check matrix H 900. The permutation applied to original parity-check matrix H 900 may result in encoder-optimized parity-check matrix H' 950 having square matrix $H_{2d}$ 970, where square matrix $H_{2d}$ 970 is a block diagonal matrix that includes a set of square submatrices 972. The set of square submatrices 972 may include square submatrices of same or different sizes on the diagonal of square matrix $H_{2d}$ 970. Each row of encoder-optimized parity-check matrix H' 950 may correspond to a check node and each column may correspond to a variable node as described above. For example, the rows of original parity-check matrix H 900 may be permutated such that rows C0, C1, . . . , and C9 in the decoder may be re-arranged according to an order of rows C1, C8, C9, C7, C5, C3, C6, C2, C0, and C4 in the encoder-optimized parity-check matrix. It is noted that, in various embodiments, encoder-optimized parity-check matrix H' 950 may be any (N−K)×N matrix, matrix $H_{1d}$ 960 may be an (N−K)×N matrix, and square matrix $H_{2d}$ may be an (N−K)×(N−K) matrix. It is also noted that both the rows and the columns of the original parity-check matrix H 900 may be permutated in order to generate encoder-optimized parity-check matrix H' 950.

Figure 10:
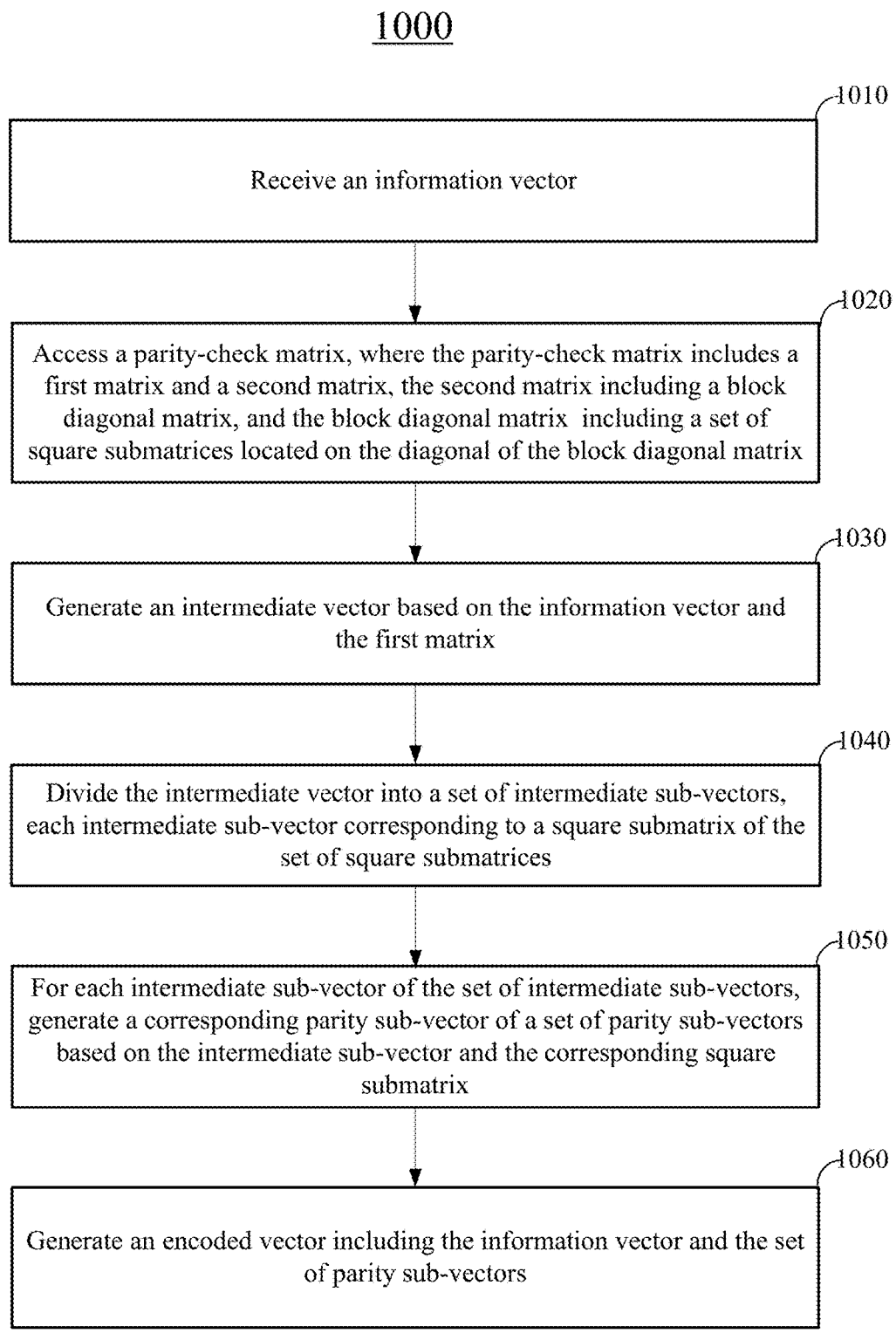
FIG. 10 is a simplified flow chart illustrating an example method for encoding information bits by an encoder, according to certain embodiments.

FIG. 10 illustrates an example flow 1000 for encoding information bits by an encoder, such as an LDPC encoder, according to certain embodiments. Operations in flow 1000 may be performed by, for example, LDPC encoder 110, LDPC encoder 700, the error correction system described above with respect to FIG. 8, or a computer system 1100 described below with respect to FIG. 11.

At operation 1010, the encoder may receive an information vector. The information vector may include data bits to be stored in a memory or other storage device, or data bits to be transmitted to a remote system or device through a communication channel. The information vector may include, for example, K-bit.

At operation 1020, the encoder may access a parity-check matrix stored locally or on a remote system in a network. The parity-check matrix may be optimized for an encoder, such as encoder-optimized parity-check matrix H' 112 or $H_d$ in Equation (6). The parity-check matrix may include a first matrix and a second matrix as described above with respect to, for example, Equation (6) and FIG. 9B. The second matrix may be a square matrix and may include a block diagonal matrix that may include a set of square submatrices located on the diagonal of the block diagonal matrix as described above with respect to, for example, Equation (9) and FIGS. 6 and 9B. For example, the parity-check matrix may be an (N−K)×N matrix, the first matrix may be an (N−K)×K matrix, and the second matrix may be an (N−K)×(N−K) matrix. The set of square submatrices may include, for example, an $a_1 \times a_1$ matrix, an $a_2 \times a_2$ matrix, . . . , and an $a_b \times a_b$ matrix, where the sum of $a_1, a_2, \ldots,$ and $a_b$ may be equal to N−K.

At operation 1030, the encoder may generate an intermediate vector based on the information vector and the first matrix. For example, the intermediate vector may include N−K bits, and may be generated by multiplying the information vector and the transpose of the first matrix as described above with respect to Equation (11).

The encoder may then generate a parity vector based on the intermediate vector and the second matrix. For example, the encoder may generate the parity vector by performing operation 1040 and operation 1050 described below.

At operation 1040, the encoder may divide the intermediate vector into a set of intermediate sub-vectors, where each intermediate sub-vector may correspond to a square submatrix of the set of square submatrices. For example, each of the intermediate sub-vector may correspond to one of the $a_1 \times a_1$ matrix, $a_2 \times a_2$ matrix, . . . , and $a_b \times a_b$ matrix, and may include one of $a_1$ bits, $a_2$ bits, . . . , and $a_b$ bits, as described above with respect to Equation (11).

At operation 1050, for each intermediate sub-vector of the set of intermediate sub-vectors, a corresponding parity sub-vector of a set of parity sub-vectors for the parity vector may be generated by the encoder based on the intermediate sub-vector and the corresponding square submatrix. For example, the encoder may include a set of operating units, and each operating unit of the set of operating units may be used to generate a parity sub-vector by multiplying an intermediate sub-vector with the inverse of the transpose of a corresponding square submatrix, as described above with respect to, for example, Equation (12) and FIG. 7. The set of operating units may generate the set of parity sub-vectors in parallel. Each parity sub-vector may include one of $a_1$ bits, $a_2$ bits, . . . , and $a_b$ bits.

At operation 1060, the encoder may generate an encoded vector including the information vector and the set of parity sub-vectors as described above with respect to, for example, Equations (3) and (8). The set of parity sub-vectors may form a parity vector. For example, the encoded vector may include N bits, the information vector may include K bits, and the parity vector may include N–K bits (i.e., the sum of $a_1, a_2, \ldots,$ and $a_b$). As described above, with respect to FIG. 7, the encoder may use a multiplexer to concatenate the information vector and the set of parity sub-vectors. The encoded vector generated by the encoder may then be written to a storage device (e.g., a NAND flash memory) or transmitted to a remote device through a communication channel, such as a bus or a wireless channel.

It is noted that even though FIGS. 8 and 10 describe the operations as sequential processes, many of the operations can be performed in parallel or concurrently. In addition, the order of the operations may be rearranged. An operation may have additional steps not included in the figure. Some operations may be optional, and thus may be omitted in various embodiments. For example, in FIG. 8, operations, such as searching for an independent set from the first parity-check matrix based on a set of rules, may also be performed. Some operations described in one block may be performed together with operations at another block. Furthermore, embodiments of the methods may be implemented in hardware, software, firmware, middleware, microcode, hardware description languages, or any combination thereof.

As described above, various general purpose or special purpose devices may be used to implement some of the methods or perform some of the operations disclosed herein. The devices may be portable (e.g., a mobile phone or a laptop computer) or stationary (e.g., a general purpose desktop computer or a server). Some devices may include some or all components for performing some or all operations disclosed herein. Some devices may be combined with one or more other devices to perform some or all operations disclosed herein.

Figure 11:
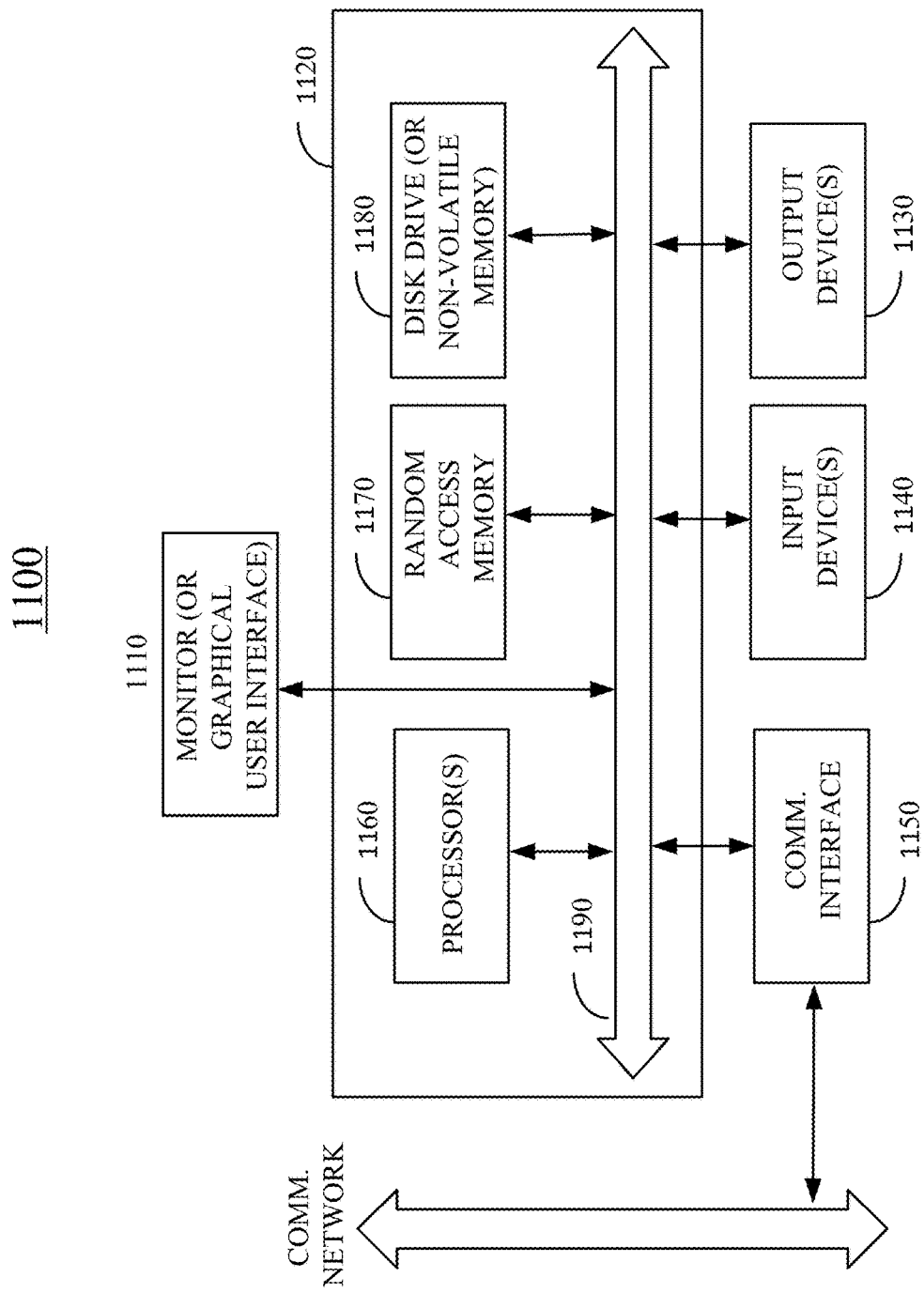
FIG. 11 is a simplified block diagram of an example computer system for implementing some of the examples disclosed herein.

FIG. 11 is a simplified block diagram of an example computer system 1100 for implementing some of the examples disclosed herein. For example, computer system 1100 may be used to implement LDPC encoder 110, LDPC decoder 140, LDPC encoder 500, LDPC encoder 700, and the offline system and/or the error correction system described above with respect to FIG. 8. It is noted that FIG. 11 is merely illustrative of an embodiment of the present disclosure and does not limit the scope of the disclosure as recited in the claims. In one embodiment, computer system 1100 may include a monitor (or graphic user interface) 1110, a computing device 1120, user output device(s) 1130, user input device(s) 1140, a communications interface 1150, and the like.

As shown in FIG. 11, computing device 1120 may include a processor(s) 1160 that communicates with a number of peripheral devices via a bus subsystem 1190. These peripheral devices may include user output devices 1130, user input devices 1140, communications interface 1150, and a storage subsystem, such as random access memory (RAM) 1170 and a disk drive (or non-volatile memory) 1180.

User input devices 1140 may include all possible types of devices and mechanisms for inputting information to computing device 1120. These may include a keyboard, a keypad, a touch screen incorporated into the display, audio input devices such as voice recognition systems, microphones, and other types of input devices. In various embodiments, user input devices 1140 may include a computer mouse, a trackball, a track pad, a joystick, a wireless remote controller, a drawing tablet, a voice command system, an eye tracking system, and the like. User input devices 1140 may allow a user to select objects, icons, text, and the like that appear on monitor 1110 via a command such as a click of a button or the like.

User output devices 1130 include all possible types of devices and mechanisms for outputting information from computing device 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 may include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computing device 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, computing device 1120 includes one or more Xeon microprocessors from Intel as processor(s) 1160. Further, in one embodiment, computing device 1120 may include a UNIX-based operating system.

RAM 1170 and disk drive 1180 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1170 and disk drive 1180 may be configured to store the basic programming and data constructs that provide the functionality of the present disclosure.

Software code modules and instructions that provide the functionality of the present disclosure may be stored in RAM 1170 and disk drive 1180. These software modules may be executed by processor(s) 1160. RAM 1170 and disk drive 1180 may also provide a repository for storing data used in accordance with the present disclosure.

RAM 1170 and disk drive 1180 may include a number of memories including a main random access memory (RAM) for storage of instructions and data during program execution and a read only memory (ROM) in which fixed non-transitory instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 may provide a mechanism for letting the various components and subsystems of computing device 1120 communicate with each other as intended. Although bus subsystem 1190 is shown schematically as a single bus, alternative embodiments of the bus subsystem may utilize multiple busses.

FIG. 11 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A computer-implemented method of encoding an information vector, the computer-implemented method comprising:

receiving, by a computer system, the information vector to be encoded into a low-density parity-check (LDPC) codeword;

accessing, by the computer system from a computer memory, a parity-check matrix, wherein:

the parity-check matrix, as stored in the computer memory, is optimized to reduce a computational complexity for generating a parity vector by including a first matrix and a second matrix;

the second matrix, as stored in the computer memory, includes a block diagonal matrix; and the block diagonal matrix, as stored in the computer memory, includes a set of square submatrices located on a diagonal of the block diagonal matrix;

generating, by the computer system, an intermediate vector based on the information vector and the first matrix;

generating the parity vector based on the intermediate vector and the second matrix;

generating, by the computer system, the LDPC codeword including the information vector and the parity vector; and storing the LDPC codeword in the computer memory.

2. The computer-implemented method of claim 1, wherein storing the LDPC codeword comprises writing the LDPC codeword to the computer memory.

3. The computer-implemented method of claim 1, wherein generating the parity vector comprises:

dividing, by the computer system, the intermediate vector into a set of intermediate sub-vectors, each intermediate sub-vector corresponding to a square submatrix of the set of square submatrices; and for each intermediate sub-vector of the set of intermediate sub-vectors, generating, by the computer system, a corresponding parity sub-vector of a set of parity sub-vectors for the parity vector based on the intermediate sub-vector and the corresponding square submatrix.

4. The computer-implemented method of claim 3, wherein generating the corresponding parity sub-vector of the set of parity sub-vectors based on the intermediate sub-vector and the corresponding square submatrix comprises:

multiplying the intermediate sub-vector and an inverse of a transpose of the corresponding square submatrix.

5. The computer-implemented method of claim 3, wherein:

each parity sub-vector is generated by a separate operating unit of the computer system; and the parity sub-vectors are generated in parallel by corresponding operating units of the computer system.

6. The computer-implemented method of claim 3, wherein:
the information vector includes K bits;
the LDPC codeword includes N bit;
the parity-check matrix includes an (N−K)×N matrix;
the first matrix includes an (N−K)×K matrix; and
the second matrix includes an (N−K)×(N−K) matrix.

7. The computer-implemented method of claim 6, wherein:
the set of square submatrices includes a plurality of aixai matrixes, wherein i varies between 1 and N−K; and
the set of intermediate sub-vectors includes a plurality of ai-bit sub-vectors.

8. The computer-implemented method of claim 1, wherein generating the intermediate vector comprises:
multiplying the information vector and a transpose of the first matrix.

9. The computer-implemented method of claim 1, wherein generating the LDPC codeword comprises:
concatenating the information vector and the parity vector.

10. A system comprising:
one or more memories configured to store a parity-check matrix, wherein:
the parity-check matrix, as stored in the one or more memories, is optimized to reduce a computational complexity for generating a parity vector by including a first matrix and a second matrix;
the second matrix, as stored in the one or more memories, includes a block diagonal matrix; and
the block diagonal matrix, as stored in the one or more memories, includes a set of square submatrices located on a diagonal of the block diagonal matrix; and
a low-density parity-check (LDPC) encoder coupled to the one or more memories, wherein the LDPC encoder is configured to:
receive an information vector to be encoded into an LDPC codeword;
access the parity-check matrix;
generate an intermediate vector based on the information vector and the first matrix;
generate the parity vector based on the intermediate vector and the second matrix;
generate the LDPC codeword including the information vector and the parity vector; and
store the LDPC codeword in the one or more memories.

11. The system of claim 10, wherein the system further comprises a transmit unit, the transmit unit configured to:
write the LDPC codeword to the one or more memories.

12. The system of claim 10, wherein generating the parity vector comprises:
dividing the intermediate vector into a set of intermediate sub-vectors, each intermediate sub-vector corresponding to a square submatrix of the set of square submatrices; and
for each intermediate sub-vector of the set of intermediate sub-vectors,
generating a corresponding parity sub-vector of a set of parity sub-vectors for the parity vector based on the intermediate sub-vector and the corresponding square submatrix.

13. The system of claim 12, wherein:
the LDPC encoder includes a set of operating units;
each operating unit of the set of operating units is configured to generate a corresponding parity sub-vector; and
the set of operating units generates the set of parity sub-vectors in parallel.

14. The system of claim 12, wherein the LDPC encoder is configured to generate the corresponding parity sub-vector of the set of parity sub-vectors by multiplying the intermediate sub-vector and an inverse of a transpose of the corresponding square submatrix.

15. The system of claim 10, wherein the LDPC encoder is configured to generate the intermediate vector by multiplying the information vector and a transpose of the first matrix.

16. The system of claim 10, wherein the LDPC encoder includes a multiplexer, the multiplexer configured to generate the LDPC codeword by concatenating the information vector and the parity vector.

17. A non-transitory computer-readable storage medium storing a plurality of instructions that, upon execution on a system, cause the system to perform operations comprising:
receiving an information vector to be encoded into a low-density parity-check (LDPC) codeword;
accessing a parity-check matrix from the non-transitory computer-readable storage medium of the system, wherein:
the parity-check matrix, as stored in the non-transitory computer-readable storage medium, is optimized to reduce a computational complexity for generating a parity vector by including a first matrix and a second matrix;
the second matrix, as stored in the non-transitory computer-readable storage medium, includes a block diagonal matrix; and
the block diagonal matrix, as stored in the non-transitory computer-readable storage medium, includes a set of square submatrices located on a diagonal of the block diagonal matrix;
generating an intermediate vector based on the information vector and the first matrix;
generating the parity vector based on the intermediate vector and the second matrix;
generating the LDPC codeword including the information vector and the parity vector; and
storing the LDPC codeword in the non-transitory computer-readable storage medium.

18. The non-transitory computer-readable storage medium of claim 17, wherein storing the LDPC codeword comprises writing the LDPC codeword to the non-transitory computer-readable storage medium.

19. The non-transitory computer-readable storage medium of claim 17, wherein generating the intermediate vector comprises:
multiplying the information vector and a transpose of the first matrix.

20. The non-transitory computer-readable storage medium of claim 17, wherein generating the parity vector comprises:
dividing the intermediate vector into a set of intermediate sub-vectors, each intermediate sub-vector corresponding to a square submatrix of the set of square submatrices; and
performing, in parallel and for each intermediate sub-vector of the set of intermediate sub-vectors:
generating a corresponding parity sub-vector of a set of parity sub-vectors for the parity vector by multiplying a respective intermediate sub-vector of the set of intermediate sub-vectors and an inverse of a transpose of a corresponding square submatrix of the set of square submatrices.

\* \* \* \* \*